(12) United States Patent
Doebler

(10) Patent No.: US 8,551,690 B2
(45) Date of Patent: Oct. 8, 2013

(54) METHODS OF FORMING PATTERNS

(75) Inventor: Jonathan T. Doebler, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 63 days.

(21) Appl. No.: 13/355,407

(22) Filed: Jan. 20, 2012

(65) Prior Publication Data

US 2013/0189846 A1 Jul. 25, 2013

(51) Int. Cl.
G03F 7/26 (2006.01)

(52) U.S. Cl.
USPC .......................................................... 430/314

(58) Field of Classification Search
USPC .................. 430/322, 311, 315, 314, 324, 394
See application file for complete search history.

(56) References Cited

U.S. PATENT DOCUMENTS

| | | | |
|---|---|---|---|
| 6,362,057 B1 * | 3/2002 | Taylor et al. | 438/286 |
| 7,175,944 B2 | 2/2007 | Yin et al. | |
| 7,790,360 B2 | 9/2010 | Alapati et al. | |
| 7,820,553 B2 | 10/2010 | Chu et al. | |
| 7,915,171 B2 | 3/2011 | Wallace et al. | |
| 8,026,172 B2 | 9/2011 | Wang et al. | |
| 8,039,399 B2 | 10/2011 | Niroomand et al. | |
| 8,080,443 B2 | 12/2011 | Chen et al. | |
| 8,211,803 B2 | 7/2012 | Sandhu et al. | |
| 8,266,558 B2 | 9/2012 | Wells | |
| 2008/0254637 A1 | 10/2008 | Hanson et al. | |
| 2010/0170868 A1 | 7/2010 | Lin et al. | |
| 2010/0216307 A1 | 8/2010 | Niroomand et al. | |
| 2010/0240221 A1 | 9/2010 | Kim et al. | |
| 2011/0117719 A1 | 5/2011 | Brown et al. | |
| 2011/0129991 A1 | 6/2011 | Armstrong et al. | |
| 2011/0163420 A1 | 7/2011 | Valdivia et al. | |
| 2011/0183269 A1 | 7/2011 | Zhu | |

OTHER PUBLICATIONS

U.S. Appl. No. 13/786,848, by Sipani et al. filed Mar. 6, 2013.
Laue, "Chapter 2: Crystal Structures and Symmetry", Dec. 28, 2001, 4 pages.
U.S. Appl. No. 13/712,806, by Sipani et al. filed Dec. 12, 2012.
U.S. Appl. No. 13/712,820, by Khurana et al. filed Dec. 12, 2012.
U.S. Appl. No. 13/712,830, by Trapp et al. filed Dec. 12, 2012.

* cited by examiner

Primary Examiner — Kathleen Duda
Assistant Examiner — Caleen Sullivan
(74) Attorney, Agent, or Firm — Wells St. John P.S.

(57) ABSTRACT

Some embodiments include methods in which photolithographically-patterned photoresist features are used as templates during formation of a series of annular structures. The annular structures have linear segments. The linear segments are within a pattern having a pitch which is less than or equal to about half of a pitch of a pattern containing the photoresist features. An expanse of photoresist is formed across the annular structures. The expanse is photolithographically patterned to form chop patterns over ends of the annular structures, and to form at least one opening over at least one of the linear segments. The annular structures are etched while using the patterned photoresist expanse as a mask. In some embodiments, an opening in a photoresist expanse aligns to an edge of a linear segment through scum generated during photolithographic patterning of the photoresist expanse.

27 Claims, 14 Drawing Sheets

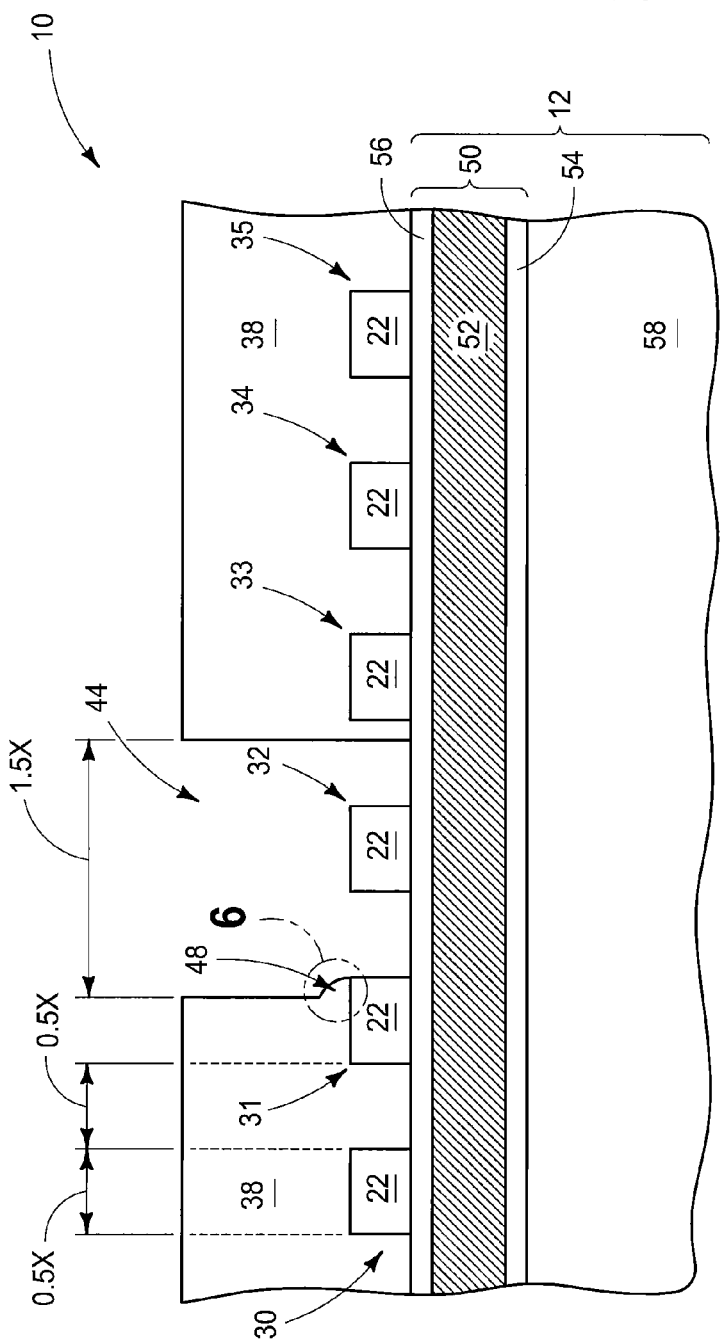
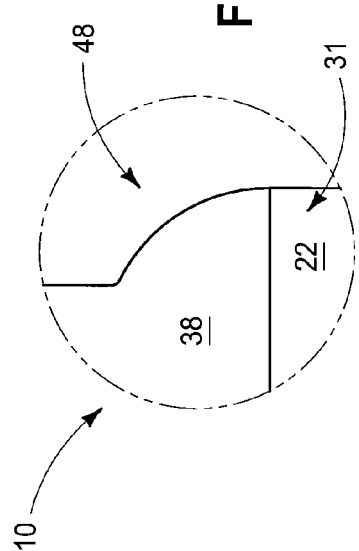
FIG. 5
FIG. 6

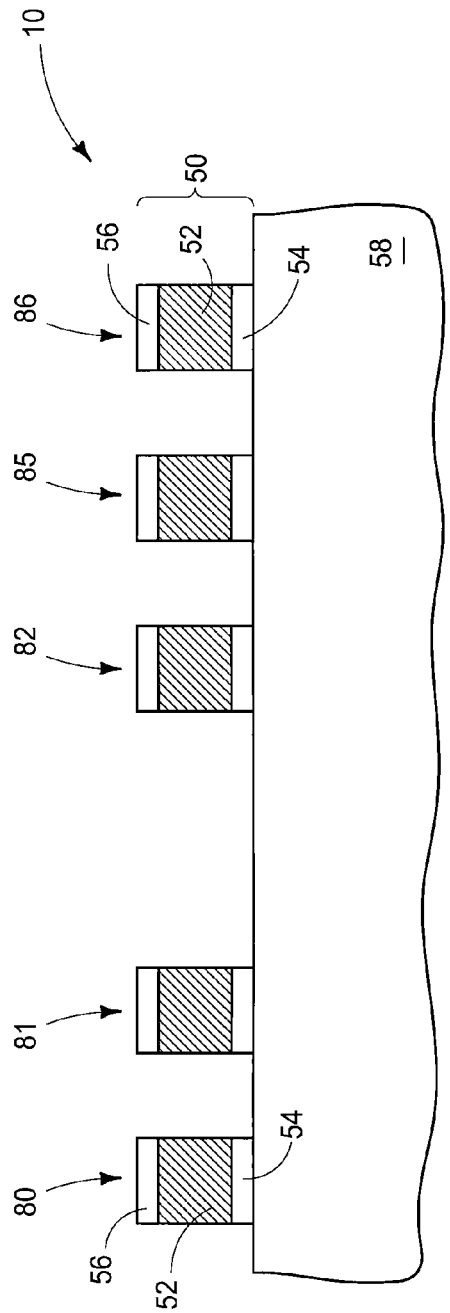
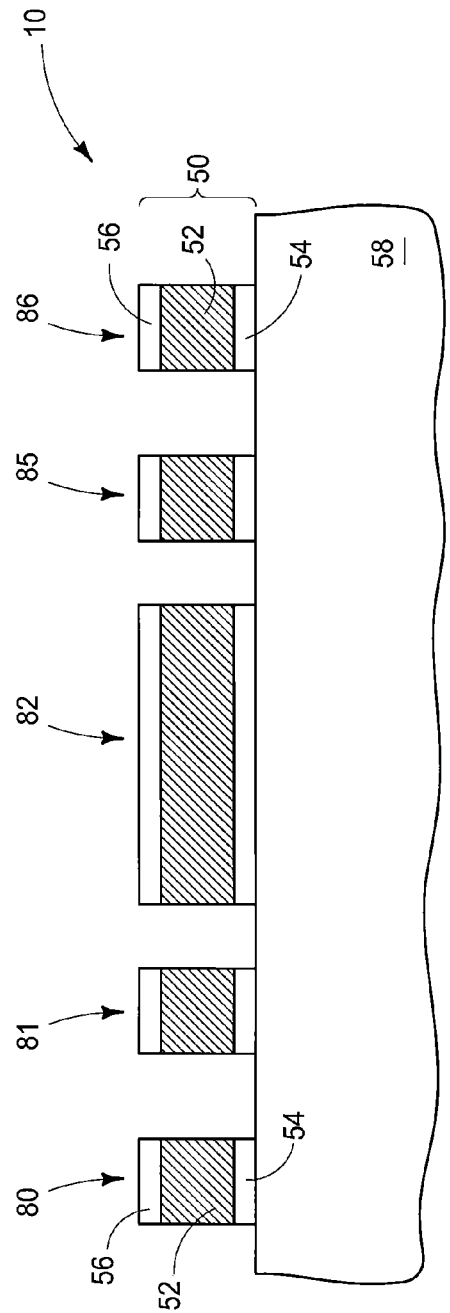

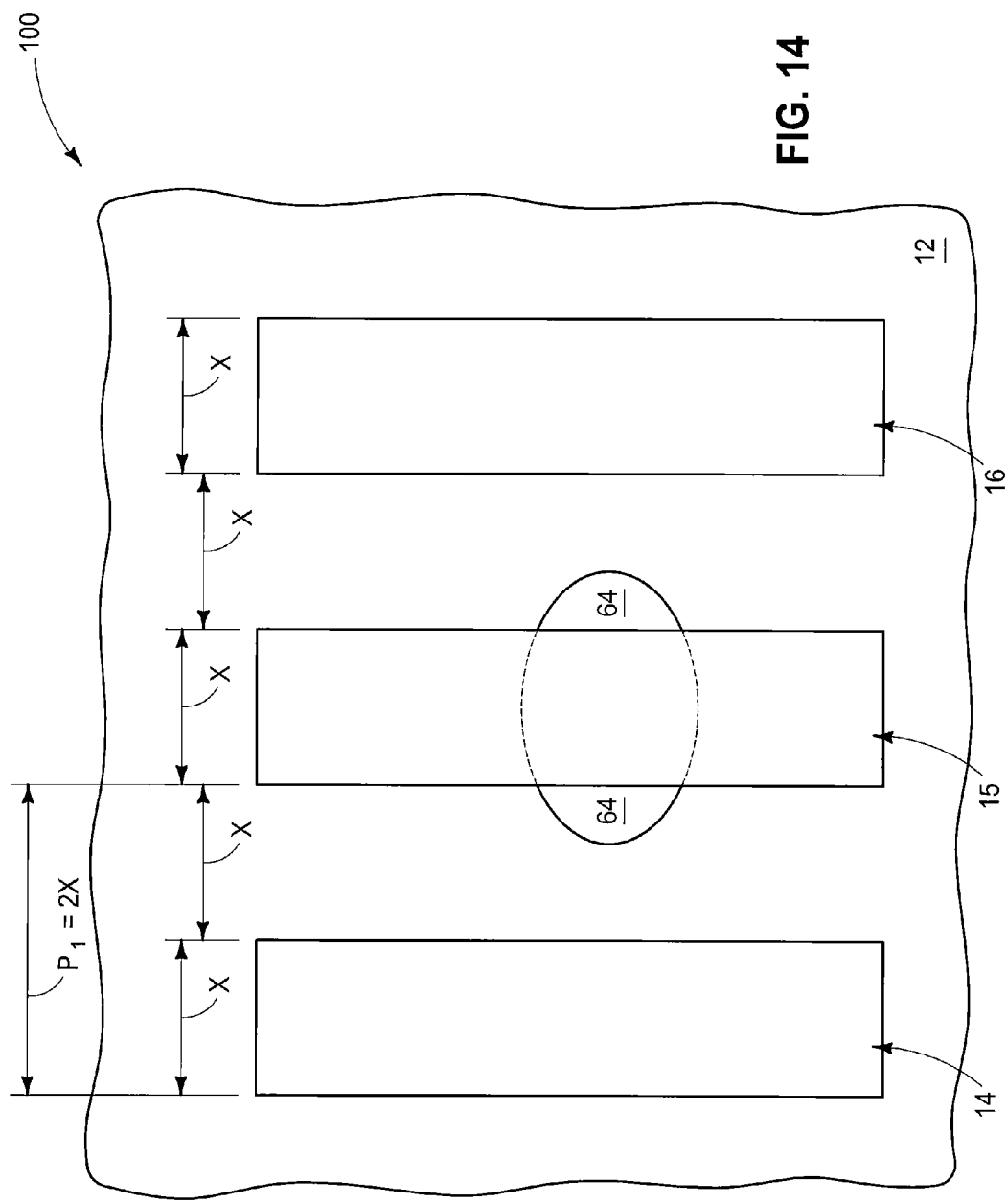

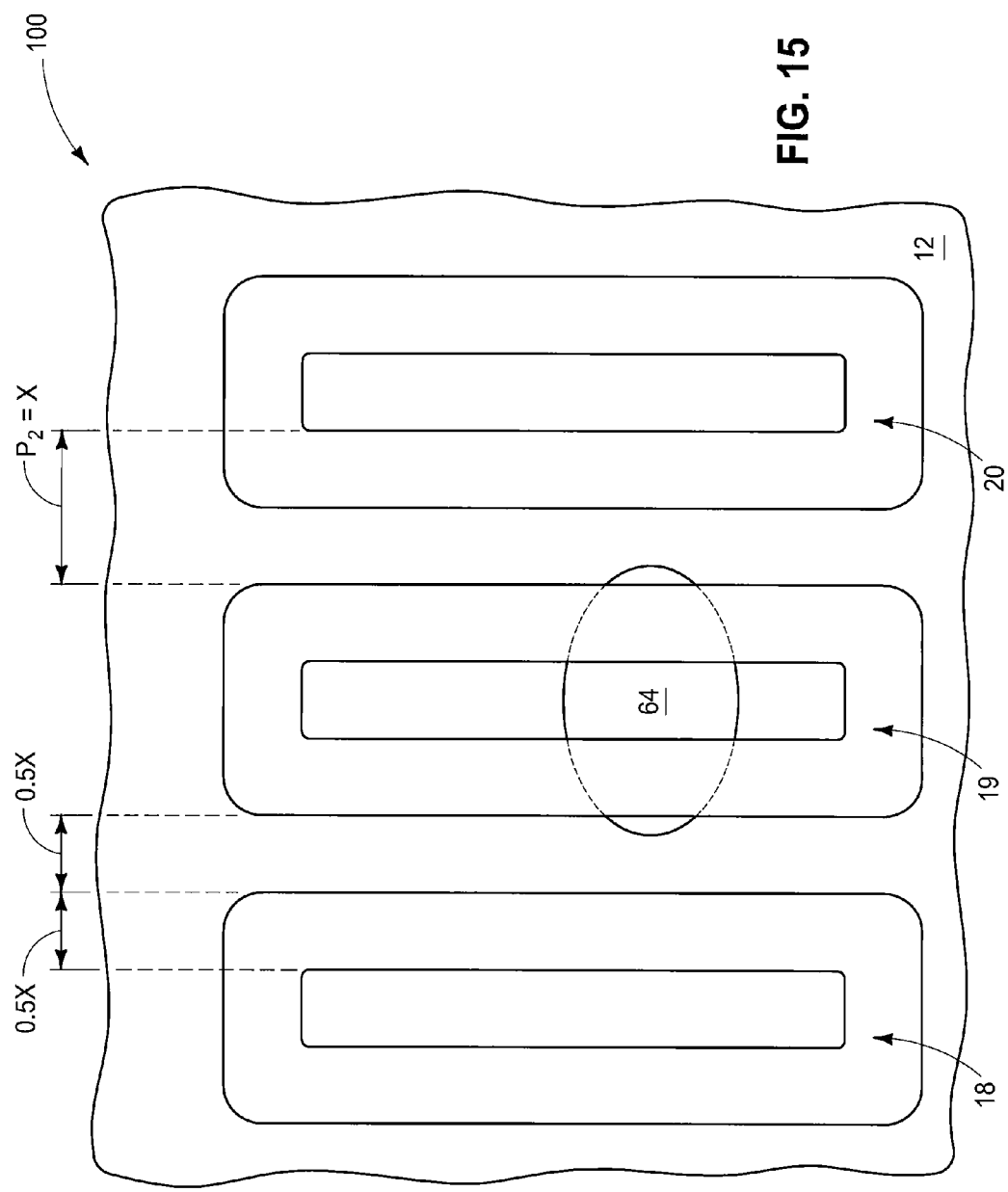

METHODS OF FORMING PATTERNS

TECHNICAL FIELD

Methods of forming patterns.

BACKGROUND

Photolithography is commonly utilized during semiconductor processing. For instance, photolithography may be utilized during integrated circuit fabrication. Photolithography comprises patterning of photoresist by exposing the photoresist to patterned actinic energy and developer.

A continuing goal in semiconductor processing is to reduce the size of individual electronic components, and to thereby enable smaller and denser integrated circuitry. A concept commonly referred to as "pitch" can be used to quantify the density of an integrated circuit pattern. Pitch may be defined as the distance between an identical point in two neighboring features of a repeating pattern. However, due to factors such as optics and actinic radiation wavelength, a photolithographic technique will tend to have a minimum pitch below which the particular photolithographic technique cannot reliably form features. Thus, minimum pitches associated with photolithographic techniques present obstacles to continued feature size reduction in integrated circuit fabrication.

Pitch multiplication, such as pitch-doubling, is one proposed method for extending the capabilities of photolithographic techniques beyond their minimum pitch. Such may involve forming features narrower than minimum photolithographic resolution by depositing layers to have a lateral thickness which is less than that of the minimum capable photolithographic feature size, F. The layers may be anisotropically etched to form sub-photolithographic features. The sub-photolithographic features may then be used for integrated circuit fabrication to create higher density circuit patterns than can be achieved with conventional photolithographic processing.

Difficulties may be encountered in processing associated with sub-photolithographic structures. Specifically, it may be advantageous to utilize traditional photolithography for processing occurring before or after formation of the sub-photolithographic features; but traditional photolithography will form structures having minimum feature sizes of at least F. It can be difficult to align a photolithographic-scale structure to a sub-photolithographic-scale structure. It would therefore be desirable to develop new methods for aligning photolithographic-scale structures to sub-photolithographic-scale structures.

BRIEF DESCRIPTION OF THE DRAWINGS

FIGS. 1-13 diagrammatically illustrate an example embodiment method of forming a pattern. FIGS. 1-4, 7, 8 and 11 are top views of a portion of a construction illustrated at various process stages. FIG. 5 is a view along the section A-A of FIG. 4, and FIG. 6 is a zoomed-in view of a region of FIG. 5. FIGS. 9 and 10 are views along the sections A-A and B-B, respectively of FIG. 8. FIGS. 12 and 13 are views along the sections A-A and B-B, respectively, of FIG. 11.

FIGS. 14-16 diagrammatically illustrate another example embodiment method of forming a pattern; and are top views of a portion of a construction illustrated at various process stages.

DETAILED DESCRIPTION OF THE ILLUSTRATED EMBODIMENTS

In some embodiments, the invention includes methods of aligning photolithographic-scale structures to sub-photolithographic-scale structures. Example embodiments are described with reference to FIGS. 1-16.

Figure 1:
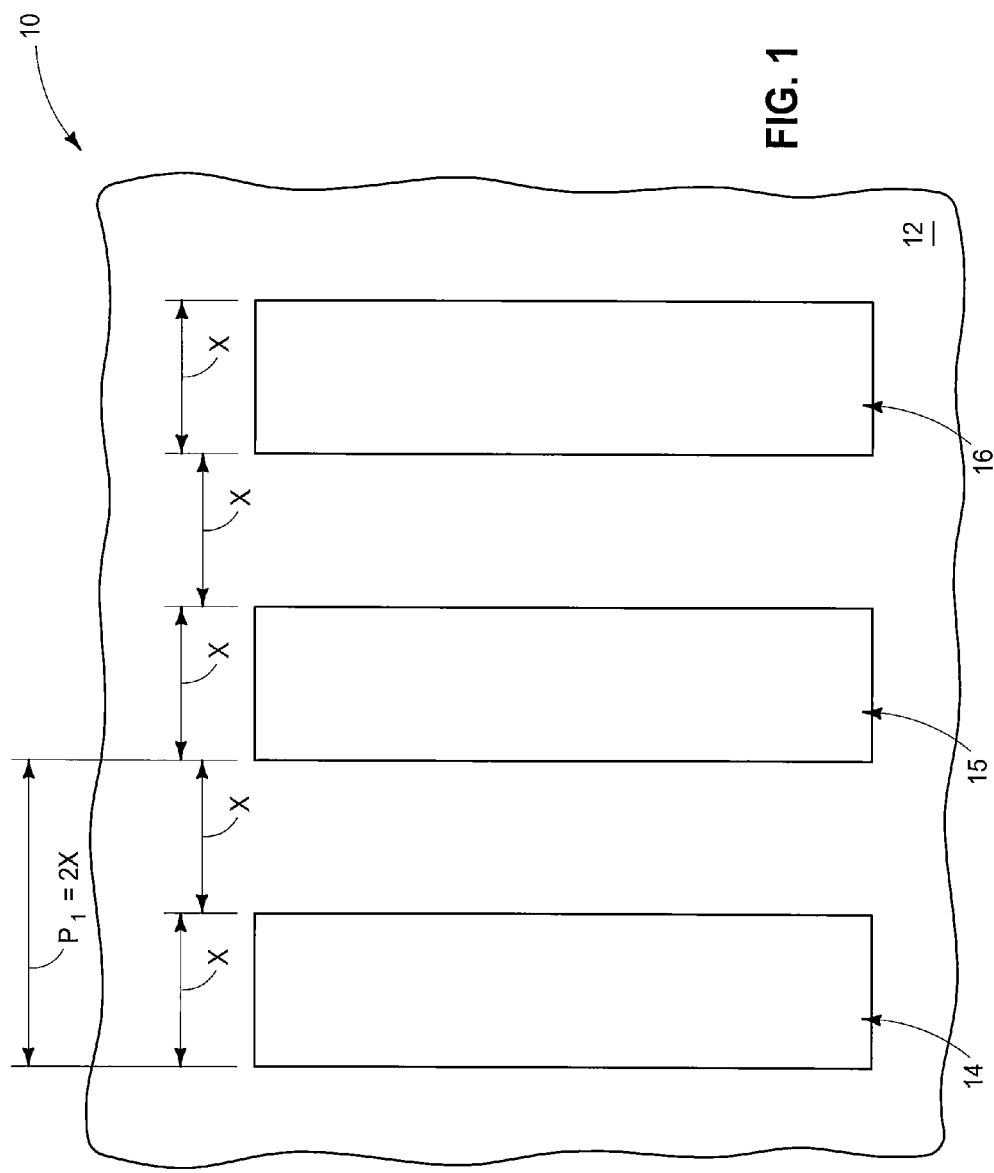

Referring to FIG. 1, a semiconductor construction 10 is illustrated in top view. The construction 10 comprises a base 12, and a plurality of photolithographically-patterned photoresist features 14-16 over the base.

Base 12 may comprise, consist essentially of, or consist of monocrystalline silicon; and may be referred to as a semiconductor substrate, or as a portion of a semiconductor substrate. The terms "semiconductive substrate," "semiconductor construction" and "semiconductor substrate" mean any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductive substrates described above. In some embodiments, base 12 may correspond to a semiconductor substrate containing one or more materials associated with integrated circuit fabrication. In such embodiments, such materials may correspond to one or more of refractory metal materials, barrier materials, diffusion materials, insulator materials, etc.

The photoresist features 14-16 have widths of about X, and are spaced from one another by distances of about X. Accordingly, the features 14-16 form a pattern having a pitch, $P_1$, of about 2X. Since the features 14-16 were formed by photolithography, the distance X is a photolithographic-scale distance. In some embodiments, the distance X may correspond to F; where F is the minimum capable photolithographic feature size of the photolithographic process utilized to form features 14-16. Currently, a common dimension of F is about 40 nanometers (nm).

The features 14-16 may be utilized as templates during a pitch-multiplication process to form a series of features within a pattern having a pitch less than $P_1$, and specifically to form a pattern having a sub-photolithographic pitch. The pitch-multiplication process may be a pitch-doubling process, a pitch-tripling process, a pitch-quadrupling process, etc. Numerous pitch-multiplication processes are known in the art; including, for example, processes described in U.S. Pat. Nos. 7,790,360 (Alapati) and 8,039,399 (Niroomand); and in U.S. Patent Publication Nos. 20110129991 (Armstrong) and 20110183269 (Zhu).

The illustrated three photoresist features may be representative of a large number (for instance, hundreds, thousands, millions, etc.) of photoresist features formed during a semiconductor fabrication process.

Figure 2:
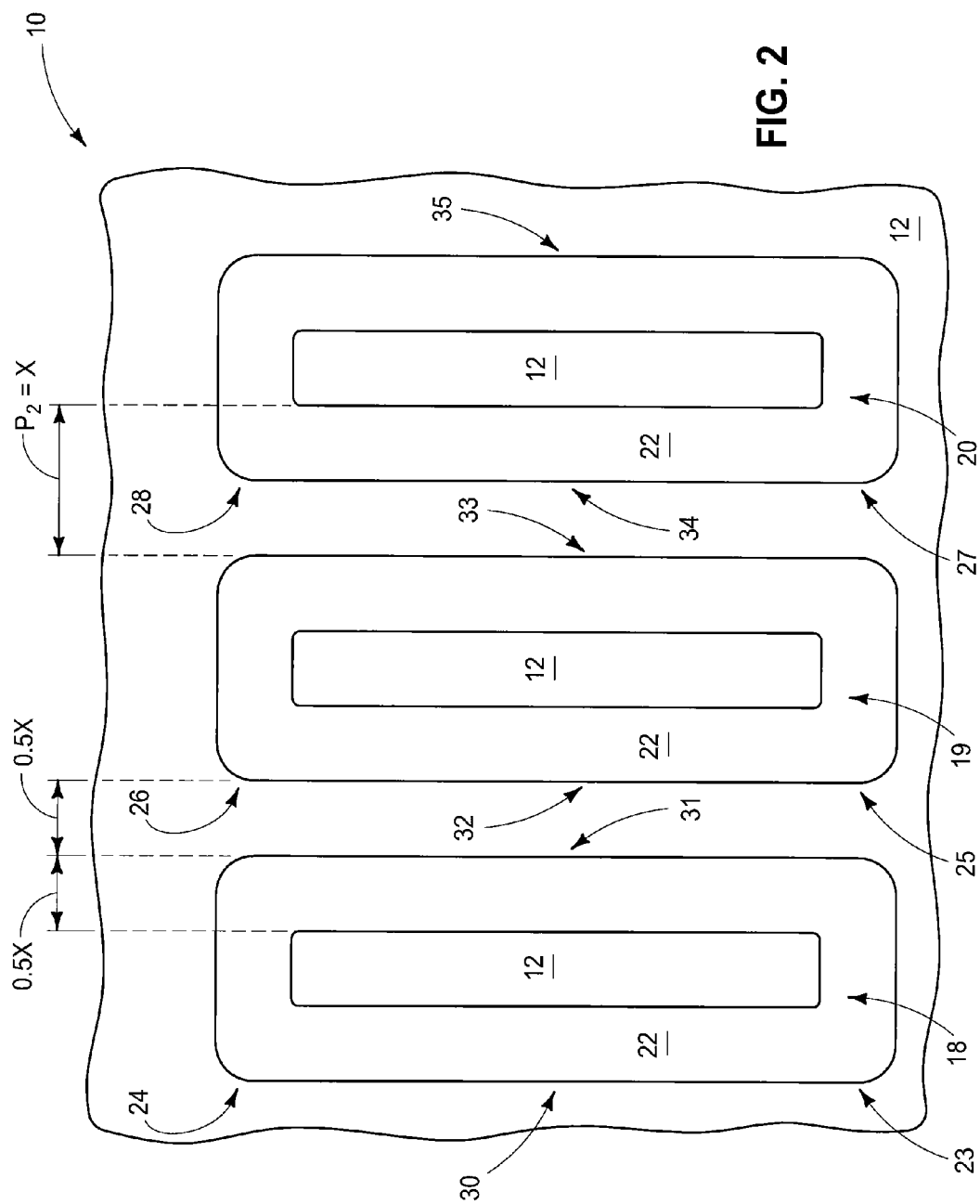

FIG. 2 shows construction 10 after utilization of the photoresist features 14-16 (FIG. 1) in an example pitch-doubling process. The pitch-doubling process has created a plurality of annular structures 18-20 centered around locations initially occupied by the photoresist features 14-16 (FIG. 1), and the photoresist features have been removed. The annular structures comprise a material 22 which is not photoresist. In some embodiments, material 22 may comprise, consist essentially of, or consist of one or both of silicon dioxide and silicon nitride.

Each of the annular structures comprises a pair of ends (with the ends of structure 18 being labeled as 23 and 24; the ends of structure 19 being labeled as 25 and 26; and the ends of structure 20 being labeled as 27 and 28). Each of the annular structures also comprises a pair of linear segments extending between the ends (with the linear segments of structure 18 being labeled as 30 and 31; the linear segments of structure 19 being labeled as 32 and 33; and the linear segments of structure 20 being labeled as 34 and 35).

The linear segments 30-35 comprise widths of about 0.5X and are spaced from one another by distances of about 0.5X in the illustrated pitch-doubling embodiment; and accordingly form a pattern having a pitch, $P_2$, of about X (i.e., form a pattern having a pitch which is about half of the pitch of the pattern of photoresist features 14-16 of FIG. 1). In embodiments in which the pitch-multiplication is at a level greater than pitch-doubling, $P_2$ will be less than ½ of $P_1$. Accordingly, if the features 14-16 of FIG. 1 are considered to be within a pattern having a pitch of about 2X, the pitch $P_2$ will be about X for a pitch-doubling process, and less than X for a pitch-multiplication process exceeding pitch-doubling (e.g., a pitch-tripling process, pitch-quadrupling process, etc.). Pitch $P_2$ may be referred to as being less than or equal to about X to generically indicate that pitch $P_2$ results from a pitch-multiplication process which is greater than or equal to pitch-doubling.

Although the shown embodiment has the linear segments 30-35 with a same width as the spaces between such linear segments, in other embodiments the widths between the linear segments may be of a different dimension than the widths of the linear segments. Regardless, the pitch of the linear segments 30-35 is sub-photolithographic if the widths of such segments are sub-photolithographic, and/or if the spaces between the linear segments are sub-photolithographic. As mentioned above with reference to FIG. 1, in some embodiments X may correspond to the minimum capable photolithographic feature size F. In such embodiments, the widths of linear segments 30-35 will be about 0.5F for a pitch-doubling process, or even less for a pitch-multiplication process that exceeds pitch-doubling. Even in embodiments in which X does not correspond to the minimum capable photolithographic feature size, the resulting pitch $P_2$ at the processing stage of FIG. 2 may be a sub-photolithographic pitch.

In some embodiments, the annular structures 18-20 may be considered to be "racetracks" due to such annular structures having shapes analogous to the shapes of oval racetracks.

Figure 3:
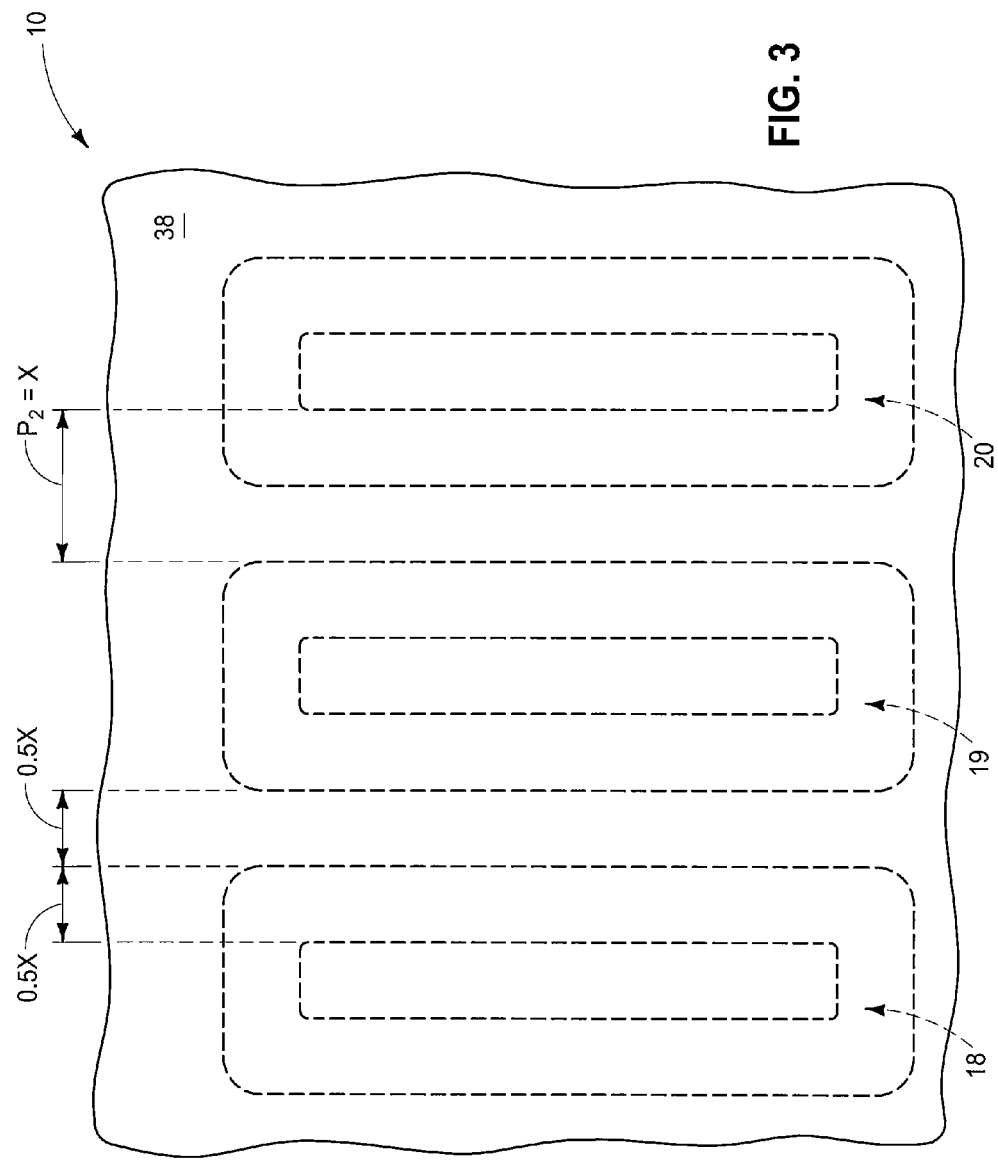

Referring to FIG. 3, an expanse of photoresist 38 is formed across annular structures 18-20. The annular structures are shown in phantom (i.e. dashed-line) view to indicate that such structures are beneath photoresist 38.

Figure 4:
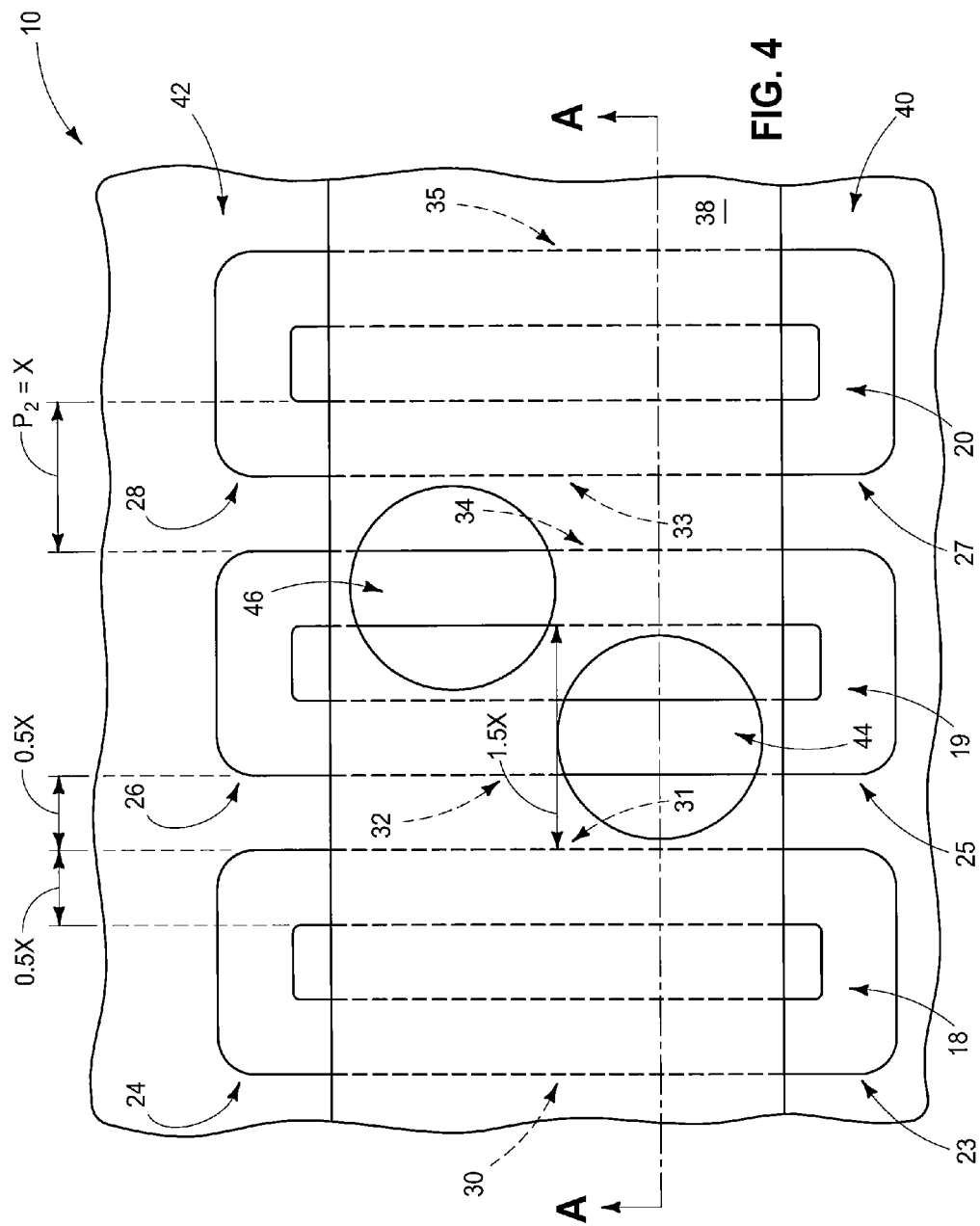

Referring to FIG. 4, the photoresist 38 is photolithographically-patterned. Such patterning may comprise exposure of the photoresist to actinic radiation, followed by utilization of developer to remove some regions of the photoresist while leaving the remaining photoresist as a mask. In the shown embodiment, the photolithographic patterning removes photoresist from over the ends 23-28 of the annular structures 18-20. Such creates chop patterns 40 and 42 across the ends, and specifically creates patterns which enable the ends of the annular structures to be selectively removed relative to the linear segments 30-35 at a subsequent processing stage (discussed below with reference to FIG. 7).

The illustrated photolithographic patterning of resist 38 forms a pair of openings 44 and 46 over regions of the linear segments 32 and 33. The regions of the linear segments exposed within the openings may be considered to correspond to break locations of the segments; and specifically may correspond to locations which will be selectively removed relative to other portions of the linear segments at a subsequent processing stage (discussed below with reference to FIG. 7). In some embodiments, the openings 44 and 46 may be considered to pattern breaks which will be formed through the underlying segments.

The openings 44 and 46 may have any suitable shapes. Regardless of the shapes of the openings, the openings will have minimum cross-sectional widths greater than or equal to the minimum capable photolithographic feature size F of the photolithographic process utilized to form such openings. In some embodiments, the minimum cross-sectional widths of the openings 44 and 46 will be at least about the illustrated dimension X. In some embodiments, the minimum cross-sectional widths of the openings may be about X plus a ½X registration margin for overlay tolerance. For instance, in some embodiments X may be about 40 nm and the registration margin may be about 20 nm; and the openings may have minimum cross-sectional widths of about 60 nm.

In the shown embodiment, a maximum cross-sectional width of the openings 44 and 46 is less than or equal to about 1.5X (as shown relative to opening 44). If the width of an opening exceeds 1.5X there may be undesired overlap of the opening across multiple adjacent linear segments.

The illustrated two openings 44 and 46 may be representative of a large number of openings formed during a semiconductor fabrication process.

As discussed in the "Background" section of this disclosure, there may be difficulties encountered in attempting to align photolithographic-scale structures to sub-photolithographic-scale structures. For instance, it can be difficult to align the photolithographic-scale openings 44 and 46 directly over the sub-photolithographic-scale features 32 and 33. In some embodiments, it is recognized that a prior art problem associated with scum generation during photolithographic processing may be advantageously utilized to assist in alignment of photolithographic-scale structures to sub-photolithographic-scale structures.

FIG. 5 diagrammatically illustrates a cross-section along the line A-A of FIG. 4 in an embodiment in which opening 44 is misaligned relative to features 31-33. The illustrated opening 44 has a cross-sectional width of 1.5X. The misaligned opening 44 could inadvertently expose feature 31 in addition to feature 32, but scum generated during the photolithographic process protects feature 32 from being exposed. Specifically, the scum forms a protective liner 48 along a region of feature 31 that would otherwise be exposed within opening 44. The scum effectively aligns opening 44 to an edge of feature 31. Such scum-related alignment is further illustrated in the view of FIG. 6 which shows a zoomed-in view of a region of FIG. 5. The scum may be only over a top surface of feature 31 (as shown) and aligned with an edge of the top surface, or may align to a sidewall surface of the feature. In some embodiments, scum may extend along both a top surface and a sidewall surface of a feature. In some embodiments, the features (for instance, feature 31) may result from anisotropic etching during a pitch-multiplication process, and may have rounded corners; and the scum may align to such rounded corners.

The prior art problem of scum generation during photolithographic processing is described in numerous references, including, for example, U.S. Pat. Nos. 7,175,944 (Yin) and 7,820,553 (Chu); and U.S. Patent Publication No. 2008/0254637 (Hanson). The scum may be generated during development of photoresist, and may comprise any of numerous different materials including, for example, various polymers. In some embodiments of the present invention, the prior art problem of scum generation is recognized as providing an advantage for aligning photolithographic-scale structures to sub-photolithographic-scale structures through mechanisms of the types described in FIGS. 5 and 6.

FIG. 5 shows that substrate 12 may include a stack 50 of multiple materials. In the shown embodiment, the stack comprises an electrically conductive material 52 between a pair of electrically insulative materials 54 and 56. The electrically conductive material may comprise any suitable composition or combination of compositions; including, for example, one or more of various metals, metal-containing compositions and conductively-doped semiconductor materials. The electrically insulative materials may comprise any suitable composition or combination of compositions; including, for example, one or both of silicon dioxide and silicon nitride. In subsequent processing (discussed below with reference to FIGS. 11-13) the segments 30-35 are incorporated into a hard mask and utilized for patterning the stack 50. The stack 50 is one of numerous configurations that may be patterned with segments analogous to the segments 30-35 of FIG. 5. Other configurations may comprise, for example, multiple electrically conductive materials instead of the illustrated single electrically conductive material. In some example embodiments the stack 50 may correspond to a wordline stack, a bitline stack, a NAND gate stack, etc.

The stack 50 is supported over a structure 58. Such structure may correspond to a semiconductor construction; and in some embodiments such construction may include a semiconductor material wafer (for instance, a monocrystalline silicon wafer).

Figure 7:
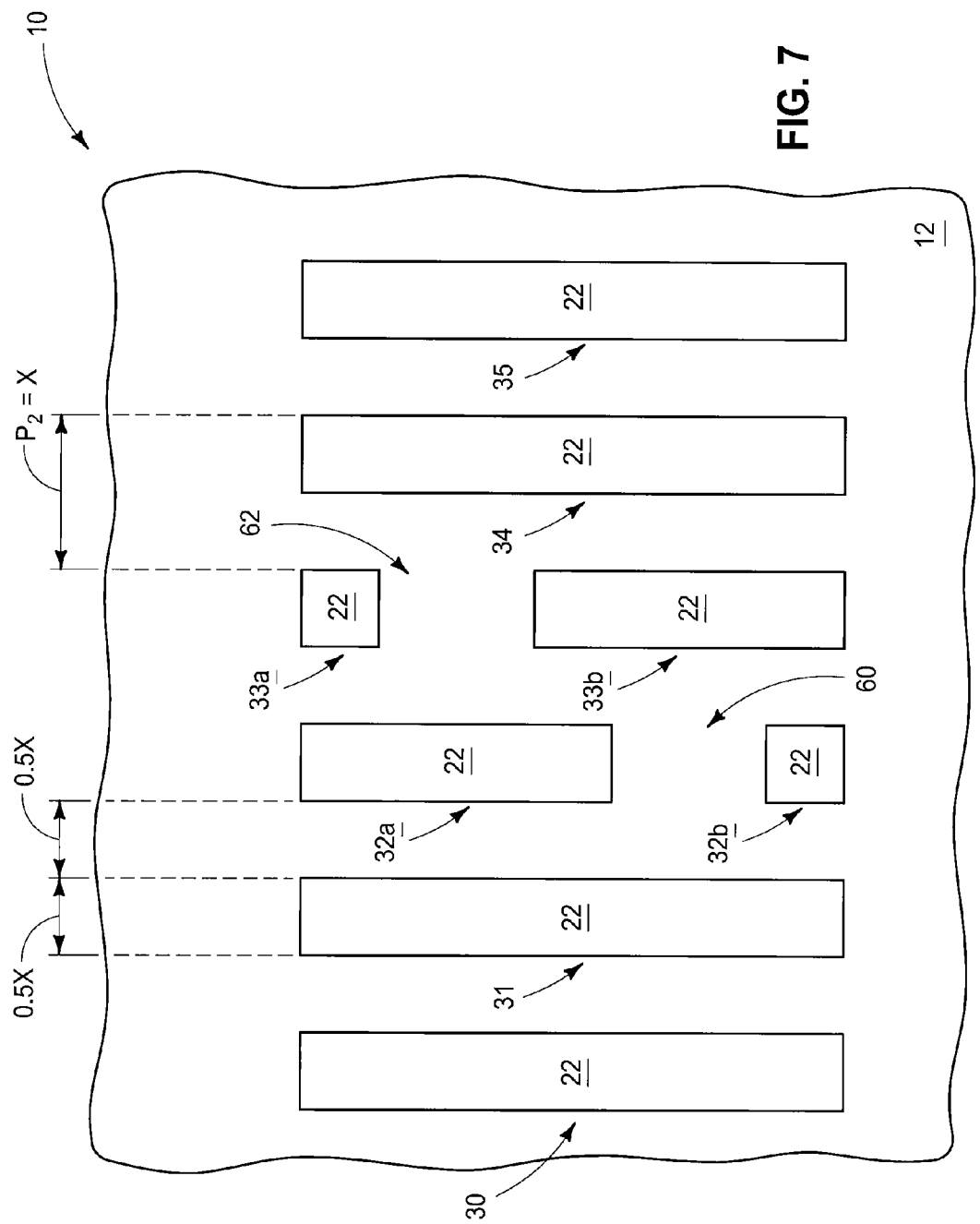

Referring to FIG. 7, regions of annular structures 18-20 (FIG. 4) which are exposed through the patterned expanse of photoresist 38 (FIG. 4) are removed with suitable etching; and then the photoresist expanse is removed. Accordingly, the ends 23-28 (FIG. 4) of annular structures 18-20 (FIG. 4) are removed, and regions of segments 32 and 33 exposed within the openings 44 and 46 (FIG. 4) are removed.

The removal of the ends 23-28 (FIG. 4) may be referred as chopping of the ends.

The construction 10 of FIG. 7 comprises the linear segments 30-35 within a pattern having pitch $P_2$. However, the etching into segments 32 and 33 through the openings 44 and 46 (FIG. 4) has separated the segment 32 into a pair of structures 32a and 32b spaced from one another by a break (i.e., gap) 60; and has separated the segment 33 into a pair of structures 33a and 33b spaced from one another by a break (i.e., gap) 62.

Figure 8:
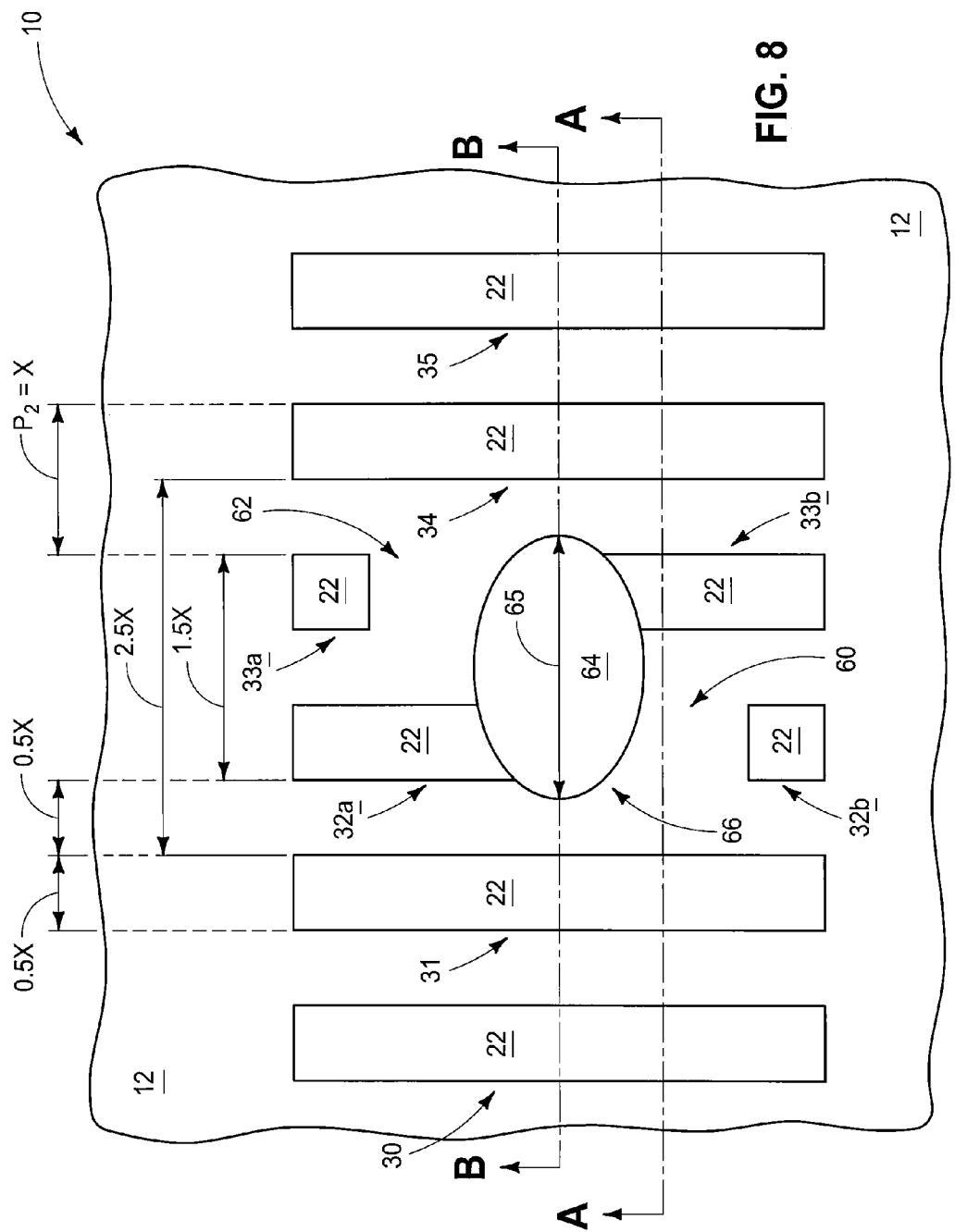
Figure 9:
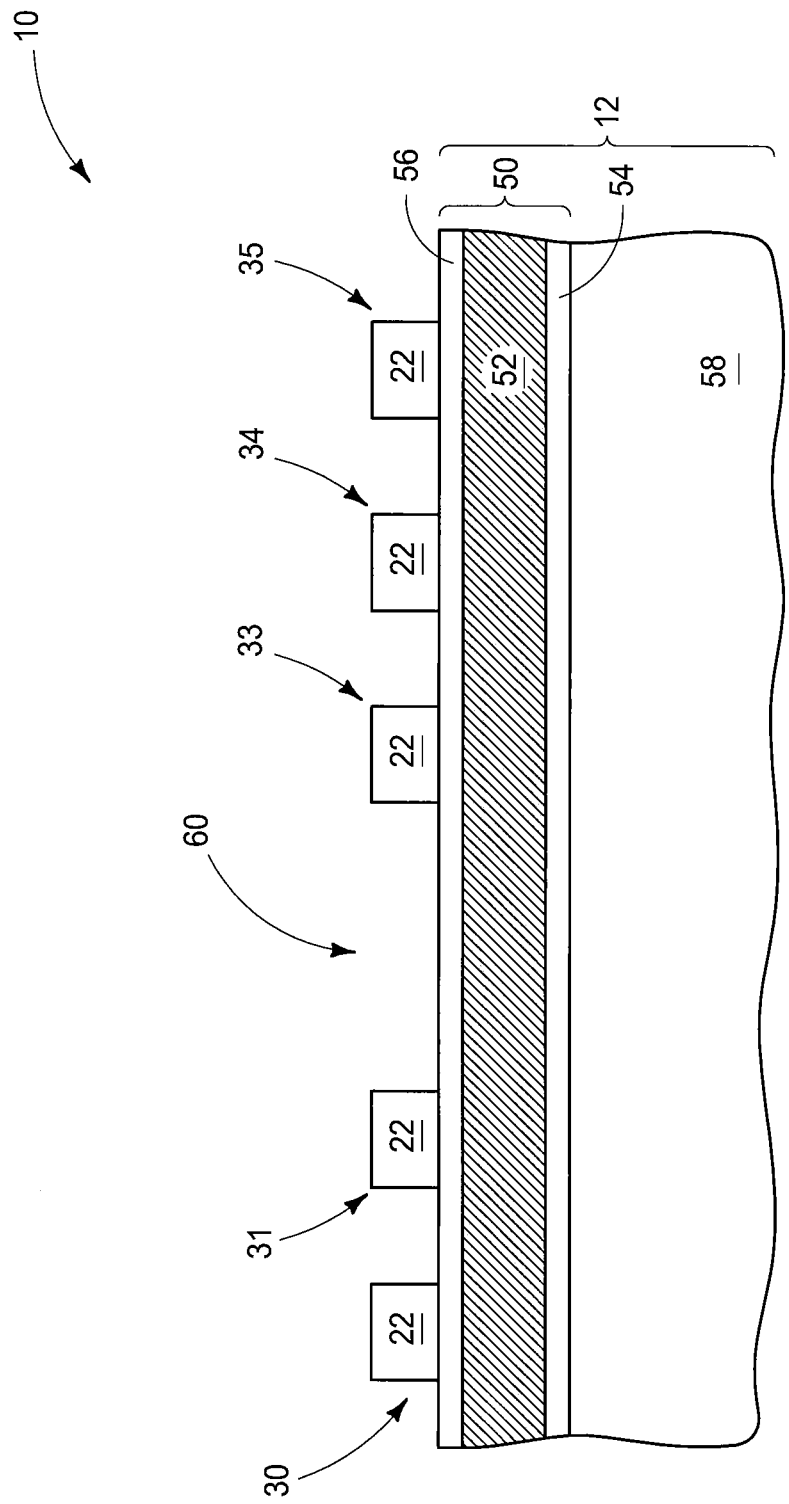
Figure 10:
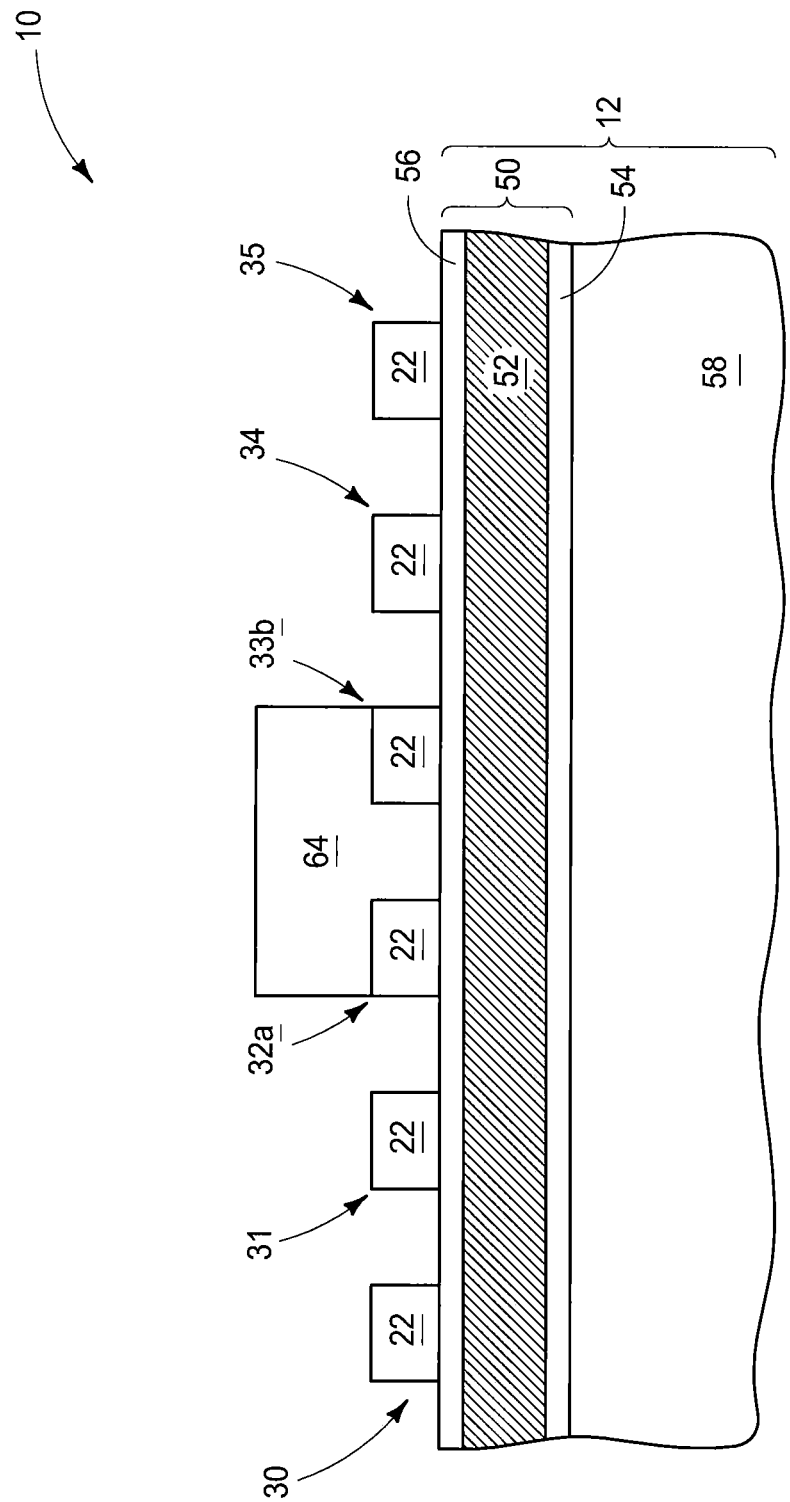

Referring to FIGS. 8-10 (with FIG. 8 being a top view, and FIGS. 9 and 10 being views along the lines A-A and B-B, respectively, of FIG. 8), a patterned material 64 is formed across segments 32a and 33b. The material 64 may comprise any suitable composition or combination of compositions; and in some embodiments may comprise, consist essentially of, or consist of one or both of silicon nitride and silicon dioxide. The material 64 may be the same composition as material 22 in some embodiments, and may be a different composition from material 22 in other embodiments.

Material 64 may be considered to form an additional pattern which creates an elbow 66 joining segment 32a to segment 33b.

The material 64 may be patterned with any suitable processing. For instance, a layer of material 64 may be formed entirely across construction 10; photolithographically-patterned photoresist may be formed across such material and a pattern transferred from the photoresist to material 64 to form the illustrated patterned material 64; and subsequently the photoresist may be removed to leave the construction of FIGS. 8-10.

In subsequent processing (discussed below with reference to FIGS. 11-13), materials 22 and 64 may be utilized as a hard mask to pattern the underlying base 12. In some embodiments, materials patterned with such hard mask will include one or more electrically conductive materials. In such embodiments, the patterned material 64 may be utilized to pattern the electrically conductive material into a conductive contact which electrically couples a conductive feature patterned by segment 32a with a conductive feature patterned by segment 33b.

The material 64 has a cross-sectional dimension 65. Such dimension may be from about 1.5X to less than about 2.5X in some embodiments (where X is the thickness of the photoresist template features 14-16 of FIG. 1). In some embodiments, material 64 may be patterned to within a registration margin of about ½X.

Figure 11:
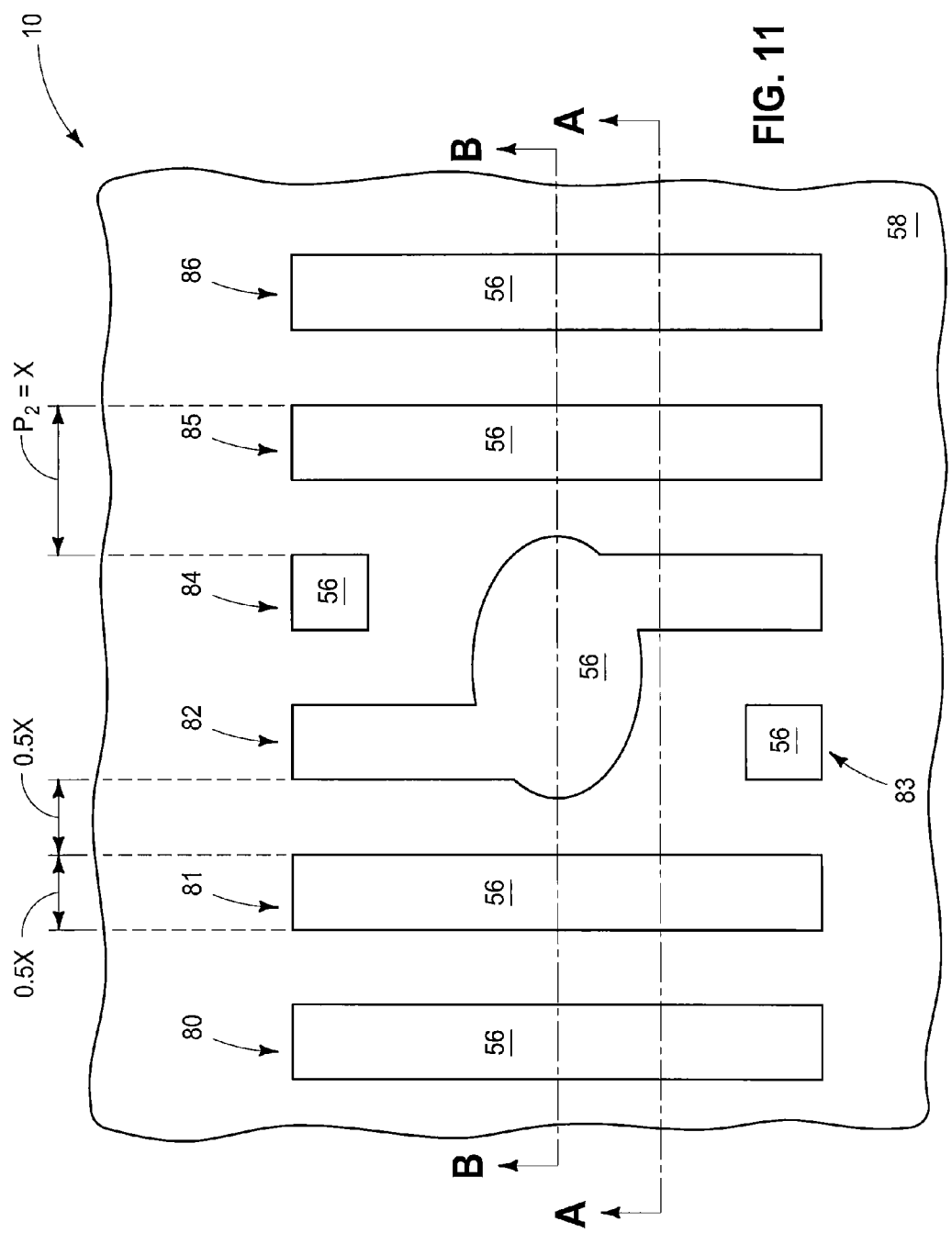

Referring to FIGS. 11-13 (with FIG. 11 being a top view, and FIGS. 12 and 13 being views along the lines A-A and B-B, respectively, of FIG. 11), the materials 22 and 64 of FIGS. 8-11 are utilized as a hard mask during patterning of the underlying stack 50, and then materials 22 and 64 are removed. In other embodiments (not shown) one or both of the materials 22 and 64 may remain in the construction after utilization of such materials as a hard mask.

The patterned materials of stack 50 form a plurality of structures 80-86. Such structures may correspond to any of numerous integrated circuit components, and/or may correspond to portions of integrated circuit components. For instance, the structures may correspond to wiring, bitlines, wordlines, NAND gates, etc.

The processing of FIGS. 11-13 utilizes the hard masking materials 22 and 64 of FIGS. 8-10 for patterning an etch into an underlying substrate. In other embodiments, the hard masking materials may be additionally or alternatively utilized for patterning dopant implanted into the substrate.

Figure 16:
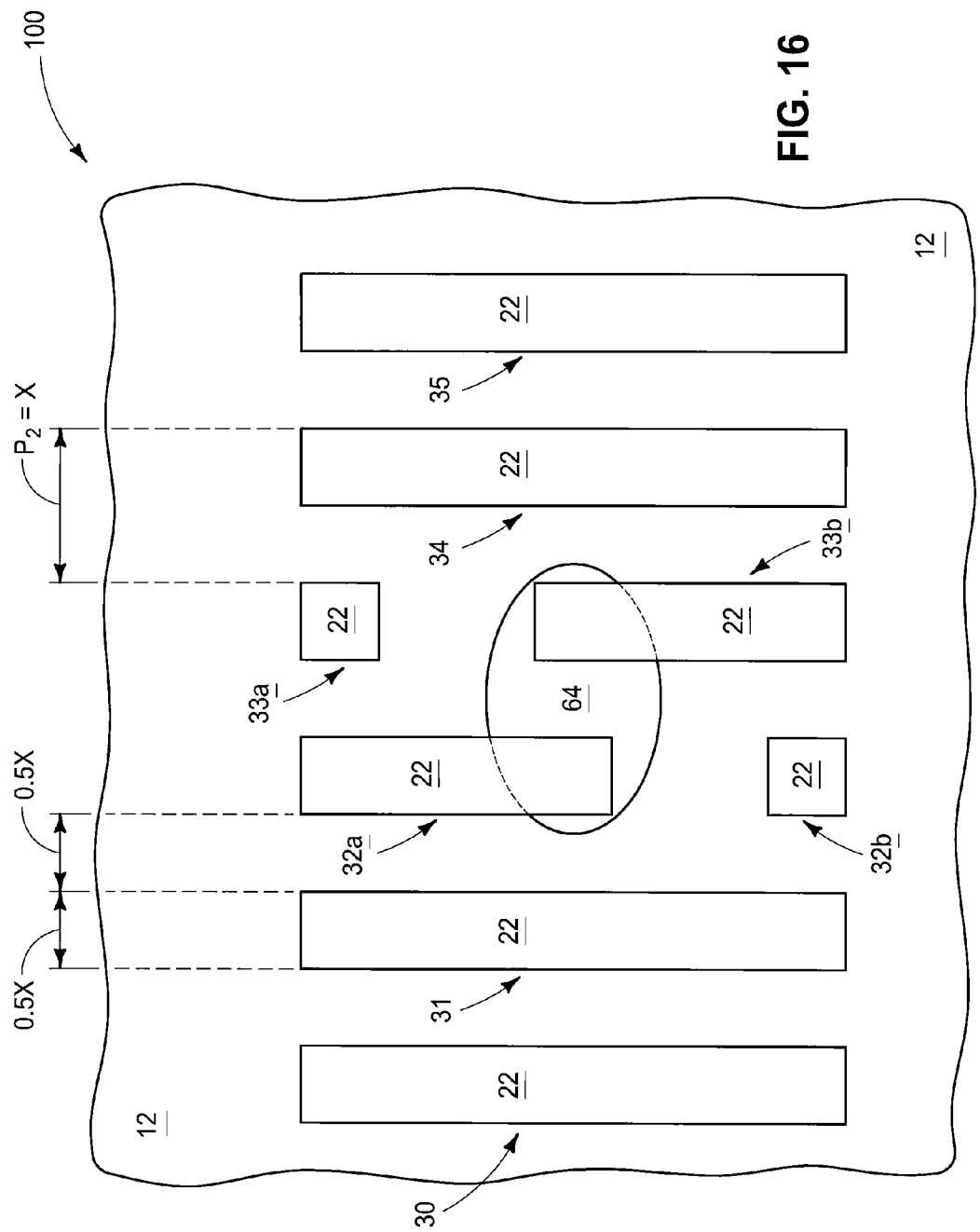

The processing of FIGS. 1-10 forms the material 64 (FIG. 8) after patterning the breaks 60 and 62 (FIG. 7) within the linear segments 32 and 33. In other embodiments, material 64 may be provided prior to patterning the breaks 60 and 62. FIGS. 14-16 illustrate an example embodiment method in which material 64 is provided prior to forming the breaks 60 and 62.

Referring to FIG. 14, a construction 100 is shown at a processing stage analogous to that of FIG. 1. The difference between the construction 100 of FIG. 14 and the construction 10 of FIG. 1 is that masking material 64 has been provided prior to forming masking features 14-16. The material 64 may be over base 12 in some embodiments, and may be within base 12 in other embodiments.

Referring to FIG. 15, construction 100 is shown at a processing stage analogous to that of FIG. 2. Construction 100 is identical to the construction 10 of FIG. 2, except that masking material 64 is under the annular structure 19.

Referring to FIG. 16, construction 100 is shown at a processing stage analogous to that of FIG. 8. Construction 100 is identical to the construction 10 of FIG. 8, except that masking material 64 is under the segments 32a and 33b, rather than being over such segments.

The construction 100 of FIG. 16 may be subsequently subjected to additional processing analogous to that described above with reference to FIGS. 11-13 to form a pattern in an underlying substrate; and/or materials 22 and 64 may be utilized as a mask during an implant of dopant into the underlying substrate.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present. When a structure is referred to as being "connected" or "coupled" to another structure, it can be directly connected or coupled to the other structure, or intervening structures may be present. In contrast, when a structure is referred to as being "directly connected" or "directly coupled" to another structure, there are no intervening structures present.

Some embodiments include a method of forming a pattern. Photolithographically-patterned photoresist features are used as templates during formation of a series of annular structures. The annular structures comprise a material other than photoresist. The annular structures comprise linear segments. The photoresist features have widths X and are within a pattern having a first pitch of about 2X. The linear segments are within a pattern having a second pitch of less than or equal to about X, with the second pitch being sub-photolithographic. An expanse of photoresist is formed across the annular structures. The photoresist expanse is photolithographically patterned to form chop patterns over ends of the annular structures, and to form one or more openings over the linear segments. The openings have minimum cross-sectional widths of at least about X. The annular structures are etched while using the patterned photoresist expanse as a mask. The etching chops the ends of the annular structures and forms one or more breaks across the linear segments.

Some embodiments include a method of forming a pattern. Photolithographically-patterned photoresist features within a pattern having a first pitch are used to form a series of segments within a pattern having a second pitch. The segments comprise a material other than photoresist. The photoresist features have widths of about X. The second pitch is less than or equal to X, with the second pitch being sub-photolithographic. An expanse of photoresist is formed across the segments. The photoresist expanse is photolithographically patterned to form an opening over a break location of a segment, with the opening having a minimum cross-sectional width of at least about X. The photolithographic patterning of the photoresist expanse comprises sequential exposure of the photoresist expanse to actinic radiation and developer. The opening aligns to an edge of one of the segments during the utilization of the developer through scum generated during the photolithographic patterning of the photoresist expanse. The break location of the segment is etched while using the patterned photoresist expanse as a mask, and such etching forms a break at the break location.

Some embodiments include a method of forming a pattern. Photolithographically-patterned photoresist features are used as templates during formation of a series of racetrack features. The racetrack features comprise a material other than photoresist. The photoresist features have widths X and are within a pattern having a first pitch, $P_1$, which is about 2X. The racetrack features comprise linear segments which are within a pattern having a second pitch, $P_2$; with the second pitch being less than or equal to about one-half of $P_1$, and being sub-photolithographic. An expanse of photoresist is formed across the racetrack features. The photoresist expanse is photolithographically patterned to form chop patterns over ends of the racetrack features, and to form one or more openings over one or more linear segments of the racetrack features. The one or more openings have minimum cross-sectional widths of at least about X. At least one of the one or more openings aligns to an edge of a linear segment through scum generated during the photolithographic patterning of the expanse. The racetrack features are etched while using the patterned photoresist expanse as a mask. The etching chops the ends of the racetrack features and forms one or more breaks across the linear segments.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

I claim:

1. A method of forming a pattern, comprising:
   using photolithographically-patterned photoresist features as templates during formation of a series of annular structures; the annular structures comprising a material other than photoresist; the annular structures comprising linear segments; the photoresist features having widths X and being within a pattern having a first pitch of about 2X; the linear segments being within a pattern having a second pitch of less than or equal to about X, with the second pitch being sub-photolithographic;
   forming an expanse of photoresist across the annular structures;
   photolithographically patterning the photoresist expanse to form chop patterns over ends of the annular structures, and to form one or more openings over the linear segments; with the openings having minimum cross-sectional widths of at least about X; and
   etching the annular structures while using the patterned photoresist expanse as a mask; the etching chopping the ends of the annular structures and forming one or more breaks across the linear segments.

2. The method of claim 1 wherein X is equal to the minimum photolithographic feature size F.

3. The method of claim 1 wherein the minimum cross-sectional width of the one or more openings is less than or equal to about 1.5X.

4. The method of claim 1 wherein the linear segments are at least part of a hard mask; and further comprising, after forming the one or more breaks, transferring a pattern of the hard mask into one or more electrically conductive materials underlying the hard mask.

5. A method of forming a pattern, comprising:
   using photolithographically-patterned photoresist features as templates during formation of a series of annular structures; the annular structures comprising a material other than photoresist; the annular structures comprising linear segments; the photoresist features having widths X and being within a pattern having a first pitch of about 2X; the linear segments being within a pattern having a second pitch of less than or equal to about X, with the second pitch being sub-photolithographic;
   forming an expanse of photoresist across the annular structures;
   photolithographically patterning the photoresist expanse to form chop patterns over ends of the annular structures, and to form one or more openings over the linear segments; with the openings having minimum cross-sectional widths of at least about X;

etching the annular structures while using the patterned photoresist expanse as a mask; the etching chopping the ends of the annular structures and forming one or more breaks across the linear segments; and wherein at least one of said one or more openings aligns to an edge of a linear segment through scum generated during the photolithographic patterning of the photoresist expanse.

6. A method of forming a pattern, comprising:

using photolithographically-patterned photoresist features as templates during formation of a series of annular structures; the annular structures comprising a material other than photoresist; the annular structures comprising linear segments; the photoresist features having widths X and being within a pattern having a first pitch of about 2X; the linear segments being within a pattern having a second pitch of less than or equal to about X, with the second pitch being sub-photolithographic;

forming an expanse of photoresist across the annular structures;

photolithographically patterning the photoresist expanse to form chop patterns over ends of the annular structures, and to form one or more openings over the linear segments; with the openings having minimum cross-sectional widths of at least about X;

etching the annular structures while using the patterned photoresist expanse as a mask; the etching chopping the ends of the annular structures and forming one or more breaks across the linear segments; and further comprising forming one or more additional patterns which connect adjacent linear segments to one another.

7. The method of claim 6 wherein at least one of the one or more additional patterns is formed after forming at least one of the one or more breaks.

8. The method of claim 6 wherein at least one of the one or more additional patterns is formed prior to forming at least one of the one or more breaks.

9. The method of claim 6 wherein the linear segments and the one or more additional patterns are at least part of a hard mask; and further comprising, after forming the one or more breaks, transferring a pattern of the hard mask into one or more electrically conductive materials underlying the hard mask.

10. A method of forming a pattern, comprising:

using photolithographically-patterned photoresist features within a pattern having a first pitch to form a series of segments within a pattern having a second pitch; the segments comprising a material other than photoresist; the photoresist features having widths of about X; the second pitch being less than or equal to X and being sub-photolithographic;

forming an expanse of photoresist across the segments;

photolithographically patterning the photoresist expanse to form an opening over a break location of a segment; the opening having a minimum cross-sectional width of at least about X; the photolithographic patterning of the photoresist expanse comprising sequential exposure of the photoresist expanse to actinic radiation and developer; the opening aligning to an edge of one of the segments during the utilization of the developer through scum generated during the photolithographic patterning of the photoresist expanse; and etching through the break location while using the patterned photoresist expanse as a mask; the etching through the break location forming a break at the break location.

11. The method of claim 10 wherein X is equal to the minimum photolithographic feature size F.

12. The method of claim 10 wherein a plurality of breaks are formed to extend through a plurality of the segments during the etching.

13. The method of claim 10 wherein the minimum cross-sectional width of the opening is less than or equal to about 1.5X.

14. The method of claim 10 wherein the segments are at least part of a hard mask; and further comprising, after forming the break, transferring a pattern of the hard mask into one or more electrically conductive materials underlying the hard mask.

15. The method of claim 10 further comprising forming one or more additional patterns which connect adjacent segments to one another.

16. The method of claim 15 wherein at least one of the one or more additional patterns is formed after forming the break.

17. The method of claim 15 wherein at least one of the one or more additional patterns is formed prior to forming the break.

18. The method of claim 15 wherein the segments and the one or more additional patterns are at least part of a hard mask; and further comprising, after forming the break, transferring a pattern of the hard mask into one or more electrically conductive materials underlying the hard mask.

19. A method of forming a pattern, comprising:

using photolithographically-patterned photoresist features as templates during formation of a series of racetrack features; the racetrack features comprising a material other than photoresist; the photoresist features having widths X and being within a pattern having a first pitch, $P_1$, which is about 2X; the racetrack features comprising linear segments; the linear segments being within a pattern having a second pitch, $P_2$, which is less than or equal to about one-half of $P_1$; with $P_2$ being sub-photolithographic;

forming an expanse of photoresist across the racetrack features;

photolithographically patterning the photoresist expanse to form chop patterns over ends of the racetrack features, and to form one or more openings over one or more linear segments of the racetrack features; the one or more openings having minimum cross-sectional widths of at least about X; at least one of the one or more openings aligning to an edge of a linear segment through scum generated during the photolithographic patterning of the expanse; and etching the racetrack features while using the patterned photoresist expanse as a mask; the etching chopping the ends of the racetrack features and forming one or more breaks across the linear segments.

20. The method of claim 19 wherein X is equal to the minimum photolithographic feature size F.

21. The method of claim 19 wherein $P_2$ is one-half of $P_1$.

22. The method of claim 19 wherein the linear segments are at least part of a hard mask; and further comprising, after forming the one or more breaks, transferring a pattern of the hard mask into one or more electrically conductive materials underlying the hard mask.

23. The method of claim 19 further comprising forming one or more additional patterns which connect adjacent linear segments to one another.

24. The method of claim 23 wherein at least one of the one or more additional patterns has a cross-sectional dimension of from about 1.5X to less than about 2.5X.

25. The method of claim 23 wherein at least one of the one or more additional patterns is formed after forming the series of racetrack features.

26. The method of claim 23 wherein at least one of the one or more additional patterns is formed prior to forming the series of racetrack features.

27. The method of claim 23 wherein the linear segments and the one or more additional patterns are at least part of a hard mask; and further comprising, after forming the one or more breaks, transferring a pattern of the hard mask into one or more electrically conductive materials underlying the hard mask.

* * * * *